United States Patent
Herzer et al.

(10) Patent No.: US 7,701,278 B2
(45) Date of Patent: Apr. 20, 2010

(54) DRIVE CIRCUIT WITH A TOP LEVEL SHIFTER FOR TRANSMISSION OF AN INPUT SIGNAL, AND METHOD FOR TRANSMISSION

(75) Inventors: Reinhard Herzer, Ilmenau (DE); Matthias Rossberg, Ilmenau (DE); Bastian Vogler, Ilmenau (DE)

(73) Assignee: SEMIKRON Elektronik GmbH & Co., Ltd., Nürnberg (DE)

( * ) Notice: Subject to any disclaimer, the term of this patent is extended or adjusted under 35 U.S.C. 154(b) by 0 days.

(21) Appl. No.: 12/069,281

(22) Filed: Feb. 8, 2008

(65) Prior Publication Data
US 2008/0231321 A1    Sep. 25, 2008

(30) Foreign Application Priority Data
Feb. 8, 2007    (DE) .................. 10 2007 006 319

(51) Int. Cl.
*H03L 5/00* (2006.01)
(52) U.S. Cl. .................. 327/333; 327/112; 327/423; 307/1; 326/63
(58) Field of Classification Search ............... 327/333, 327/112, 108, 110; 307/1; 326/63, 68
See application file for complete search history.

(56) References Cited

U.S. PATENT DOCUMENTS

| 2005/0116744 A1* | 6/2005 | Iwagami et al. ............. 327/108 |
| 2006/0113838 A1* | 6/2006 | Iwagami et al. ................. 307/1 |
| 2008/0136488 A1* | 6/2008 | Herzer et al. ............... 327/333 |

FOREIGN PATENT DOCUMENTS

DE    101 52 930    10/2002

* cited by examiner

*Primary Examiner*—Vibol Tan
(74) *Attorney, Agent, or Firm*—Cohen Pontani Lieberman & Pavane LLP

(57) ABSTRACT

A TOP level switch for use in a drive circuit in power-electronic systems having a half-bridge circuit formed by two power switches, a first so-called TOP switch and a second so-called BOT switch, which are arranged connected in series. The TOP level shifter transmits an input signal from drive logic to a TOP driver. In this case, the TOP level shifter is designed as an arrangement of an UP and a DOWN level shifter path, as well as a downstream signal evaluation circuit. In the associated method for transmission of this input signal, the signal evaluation circuit passes an output signal to the TOP driver when either the UP or the DOWN, or both, level shifter paths emit a signal to the respectively associated input of the signal evaluation circuit.

8 Claims, 5 Drawing Sheets

DRIVE CIRCUIT WITH A TOP LEVEL SHIFTER FOR TRANSMISSION OF AN INPUT SIGNAL, AND METHOD FOR TRANSMISSION

BACKGROUND OF THE INVENTION

1. Field of the Invention

This invention is directed to the field of transmission circuits, and more particularly, to level shifter used to transmit control inputs to drive power semiconductor modules 2. Description of the Related Art The invention is directed to a level shifter used with a drive circuit, and an associated method for transmission of an input signal from drive logic to a driver. Drive circuits such as these are required in power-electronic systems to drive power semiconductor switches which are arranged as individual switches or in a bridge circuit. Bridge circuits such as these are known as single-phase, two-phase or three-phase bridge circuits, with the single-phase so-called half-bridge representing a basic module of a multiplicity of power-electronic circuits. Two power switches, a first so-called TOP switch and a second so-called BOT switch, are arranged connected in series in a half-bridge circuit.

In general, a half-bridge such as this is connected to form a direct-current intermediate circuit. The output, typically the alternating-voltage connection of the half-bridge, is generally connected to a load. In general, the drive circuit comprises a plurality of circuit elements or functional blocks. The control signal is preprocessed in a first circuit, known as the drive logic, and is supplied via further components to the driver circuits and finally to the control input of the respective power switch.

For relatively high intermediate-circuit voltages, for example of more than 100 V, the drive logic is generally DC-isolated from the driver circuits since the associated power switches are at different potentials, making DC isolation essential. This isolation is required at least for the TOP switch although, for relatively high power levels, it is also applicable to the BOT switch, because of the ground potential possibly being dragged during switching. By way of example, such isolation may be provided by pulse transformers, by optocouplers or optical waveguides (galvanic isolation) or with the aid of integrated circuit technology using an HVIC (High Voltage Integrated Circuit). The latter variant is used increasingly frequently because of various advantages, such as small dimensions, low price and long life. At the same time, HVICs offer the capability to integrate a high-voltage component with a breakdown voltage that is greater than or equal to the intermediate-circuit voltage which can be used in circuits for signal level conversion, in so-called level shifters. A lateral high-voltage MOSFET is generally used for this purpose.

The described level shifter is part of the drive circuit and is preferably in the form of an integrated circuit arrangement. It is used to transmit a signal from a circuit part at a first defined reference-ground potential to a circuit part at a second reference-ground potential which is higher or lower at times then the first reference ground potential, or vice-versa. An arrangement such as this is required for an integrated and DC-isolated drive for power semiconductors.

Two fundamental isolation technologies are known to form level shifters for HVICs (Silicon on Insulator) technologies on the one hand and pn-isolated technologies (Junction Isolation) on the other hand. SOI technology offers dielectric isolation of components and component groups, but is available at the moment only up to a withstand voltage of 800 V. SQI substrate wafers are considerably more expensive than standard substrates, although the costs are compensated for by a number of advantages and considerable process simplifications which result from the dielectric isolation. In the case of pn-isolated technologies, the reverse voltage is blocked by a reverse-biased ~0 junction. This technology is available for up to 1200 V at the moment. However, production is highly complex and therefore costly. Furthermore, there are technical problems, for example with leakage currents and latch-up effects, inter alia at relatively high temperatures, for example at an operating temperature of more than 125° C., and when the ground potential is dragged during first dynamic processes.

In integrated drive circuits according to the prior art, level shifter transmission of the driver signals from the drive logic to the TOP driver is known. This is necessary since the TOP driver, in contrast to a BOT driver, is at a higher reference-ground potential, on a phase basis. According to the prior art, the signal transmission from the drive side to the TOP driver takes place by means of pulsed (dynamic) and differential transmission, that is to say switch-on and switch-off pulses are produced on the drive side from the signal to be transmitted, and are transmitted via the respective level shifter to the TOP driver. This type of transmission is distinguished by a high level of transmission reliability and low power consumption. Various integrated level shifter topologies are known. The simplest topology comprises an HV transistor with an appropriate blocking capability and a resistor, connected in series. When a signal is passed to the gate of the HV transistor, it switches on. The parallel current produced in this way through the level shifter causes a voltage drop across the resistor, and this can be detected as a signal by an evaluation circuit.

German patent application DE 101 52 930 A1 discloses an upgraded level shifter topology, in which the drive signal is transmitted in steps by means of n−1 intermediate potentials by means of n known level shifters which are connected identically in cascade. This makes it possible to use transistors which have only the n-th part of the required blocking capability of the entire level shifter. If transistors with the required blocking capability are available, the blocking capability of the level shifter can be increased by the factor n.

German patent application DE 10 2006 037 336, discloses a level shifter in the form of a series circuit formed by n series-connected HV transistors. This topology has the advantage over that disclosed in DE 101 52 930 A1 on the one hand that the power consumption is reduced and on the other hand that the circuit complexity is reduced. This results in less space being required and in reduced costs.

All the known topologies have the common feature that, with a complementary level shifter design, signals can also be transmitted from a circuit part with a high reference-ground potential to a circuit part with a low reference-ground potential. This characteristic can be used to transmit signals back from the TOP driver to the drive logic.

According to the prior art, in the case of integrated drive circuits, the drive logic (on the primary side) and the BOT driver (on the secondary side) are at the same reference-ground potential, or at reference-ground potentials which differ from one another by only a few volts, so that there is no need to transmit signals via level shifters. In this case, the connections for the reference-ground potential on the primary side and on the secondary side are generally externally shorted. However, module-internal and system-internal inductances, for example line inductances, can result in the reference-ground potential of the BOT drivers being dragged severely in the positive or negative direction during switching of the power component. This occurs particularly severely in medium-power and high-power systems in which heavy currents, for example of more than 50 A are switched. The potential difference can in this case assume values which are higher than the blocking voltage of the gate oxide of the transistors being used, for example more than 20 V. Junction isolation technologies have the disadvantage that parasitic thyristor structures can be triggered, so-called latch-up, in the negative direction if the reference-ground potential is dragged in a corresponding manner. This leads to loss of function and possibly to destruction of the components affected. SSOI technologies are not subject to this restriction, caused by the dielectric isolation of the components, so that it is possible to implement level shifter circuitry which ensures reliable signal transmission even if the reference-ground potential on the secondary side becomes negative, whether briefly or permanently.

German patent application 10 2006 050 913 discloses a level shifter such as this for BOT drivers using SOI technology in the form of an UP and DOWN level shifter path. However, this drive circuit is not adequate for a bridge topology, since the reference-ground potential of the TOP driver on the secondary side may also be more negative in the reference-ground potential on the primary side.

SUMMARY OF THE INVENTION

It is therefore an object of the invention to provide a level shifter for a driver circuit that addresses the needs of the prior art.

It is further object of the invention to provide a drive circuit, preferably in the form of an at least partially monolithically integrated circuit, in which signals can be transmitted between circuit parts whose reference-ground potential difference is greater than the withstand voltage of the gate oxide of the transistors being used.

Briefly stated, there is provided a drive circuit having a level shifter for preferably unidirectional transmission of a signal from a first circuit part with a first reference-ground potential, for example the primary side of an integrated gate driver, to a second circuit part with a second potential, for example the TOP secondary side of an integrated gate driver. According to the invention, this drive circuit is developed by having a TOP level shifter for DC-isolating transmission of this input signal. The TOP level shifter itself is in the form of an arrangement of two independently operating transmission paths, the UP and the DOWN level shifter paths, as well as a downstream signal evaluation circuit.

The UP level shifter transmits the applied level signal from the primary side to the secondary side when the reference-ground potential on the secondary side is equal to or greater than the reference-ground potential on the primary side. The DOWN level shifter transmits the applied input signal from the primary side to the secondary side when the reference-ground potential on the secondary side is equal to or less than the reference-ground potential on the primary side. At least one valid signal is therefore transmitted both when the reference-ground potential on the secondary side is higher than that on the primary side and when the reference-ground potential on the secondary side is lower than that on the primary side. The signal evaluation circuit detects the signals of the outputs of the UP and DOWN level shifters, and reconstructs the transmitted signal on the secondary side.

The method according to the invention for transmission of an input signal from the drive logic to a TOP driver within a drive circuit having a TOP level shifter is characterized in that the signal evaluation circuit passes an output signal to the TOP driver when one or both of the UP or the DOWN level shifter paths emits a signal to the respectively associated input of the signal evaluation circuit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In the drawings.

The invention will be explained in more detail with reference to FIGS. 1 to 4, in which like numerals refer to like elements.

DETAILED DESCRIPTION OF THE PRESENTLY PREFERRED EMBODIMENTS

Figure 1:
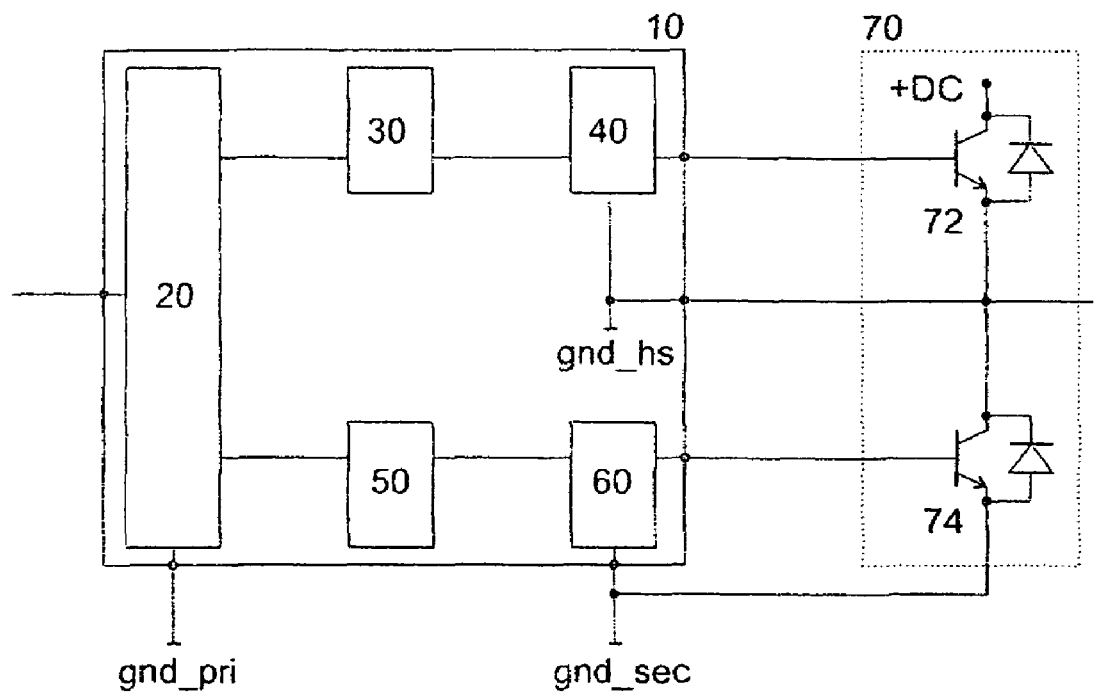
FIG. 1 shows a block diagram of a monolithically integrated drive circuit according to the prior art.

FIG. 1 shows a monolithically integrated drive circuit 10 according to the prior art with a half-bridge circuit 70. Half-bridge circuit 70 according to the prior art has a TOP power switch 72 and a BOT power switch 74, which in this case are each in the form of an ICBT with a back-to-back parallel-connected diode. The BOT switch 74 is at the reference-ground potential (gnd_sec) on the secondary side, which is virtually the same as the reference-ground potential (gnd_pri) on the primary side in applications with low line inductances. The reference-ground potential (gnd_pri) on the primary side is the reference-ground potential for the drive circuit 10.

The drive circuit 10 itself has drive logic 20, a TOP level shifter 30 with a downstream TOP driver 40, as well as a BOT level shifter 50 with a downstream BOT driver 60. The reference-ground potential of BOT driver 60 may in this case be higher than, equal to or less than the reference-ground potential of drive logic 20.

Figure 2:
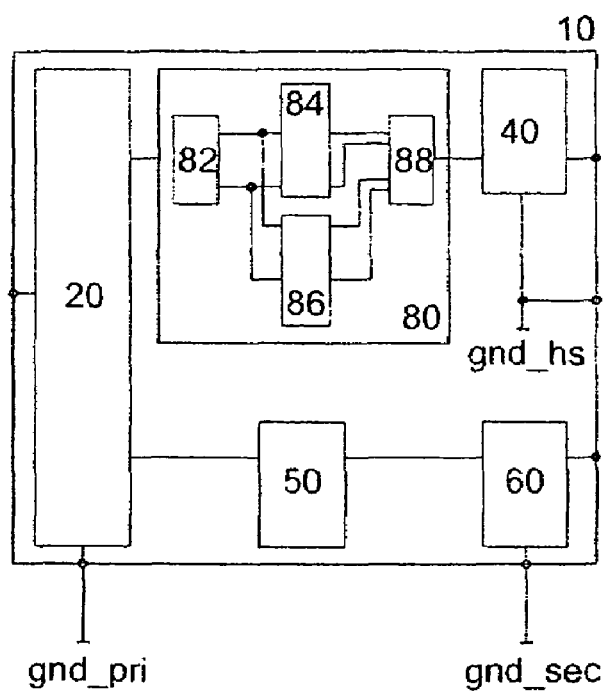
FIG. 2 shows a block diagram of a monolithically integrated drive circuit according to the invention with a TOP level shifter.

FIG. 2 shows a monolithically integrated drive circuit according to the invention with a TOP level shifter 80 which forms the development according to the invention of the prior art as shown in FIG. 1. The TOP switch 72 is at the reference-ground potential (gnd_hs) on the secondary side which, particularly in applications with high line inductances may, on a phase basis, be not only more positive but also more negative than the reference-ground potential (gnd_pri) on the primary side. In this case, TOP level shifter 80 comprises a pulse-generating circuit 82, an UP level shifter path 84, a DOWN level shifter path 86 and a signal evaluation circuit 88 downstream from them. Pulse-generating circuit 82 in each case produces a direct, non-inverted signal and an inverted signal to UP level shifter path 84, as well as the signals inverted with respect to this, via an inverter, to DOWN level shifter path 86. The output from signal evaluation circuit 88 is passed to the input of TOP driver stage 40.

Figure 3:
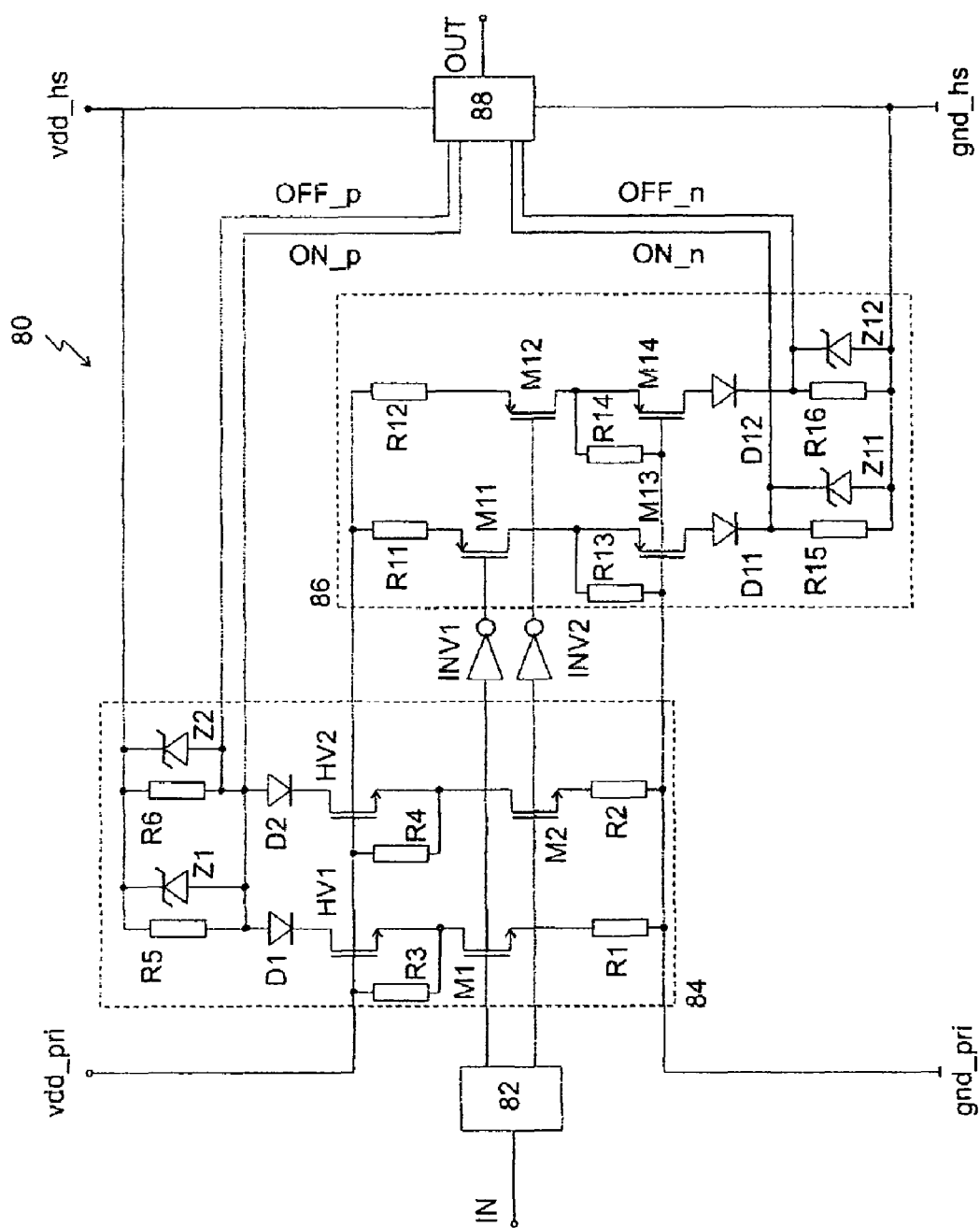
FIG. 3 shows the basic circuit of a TOP level shifter for a drive circuit according to the invention.
Figure 4A:
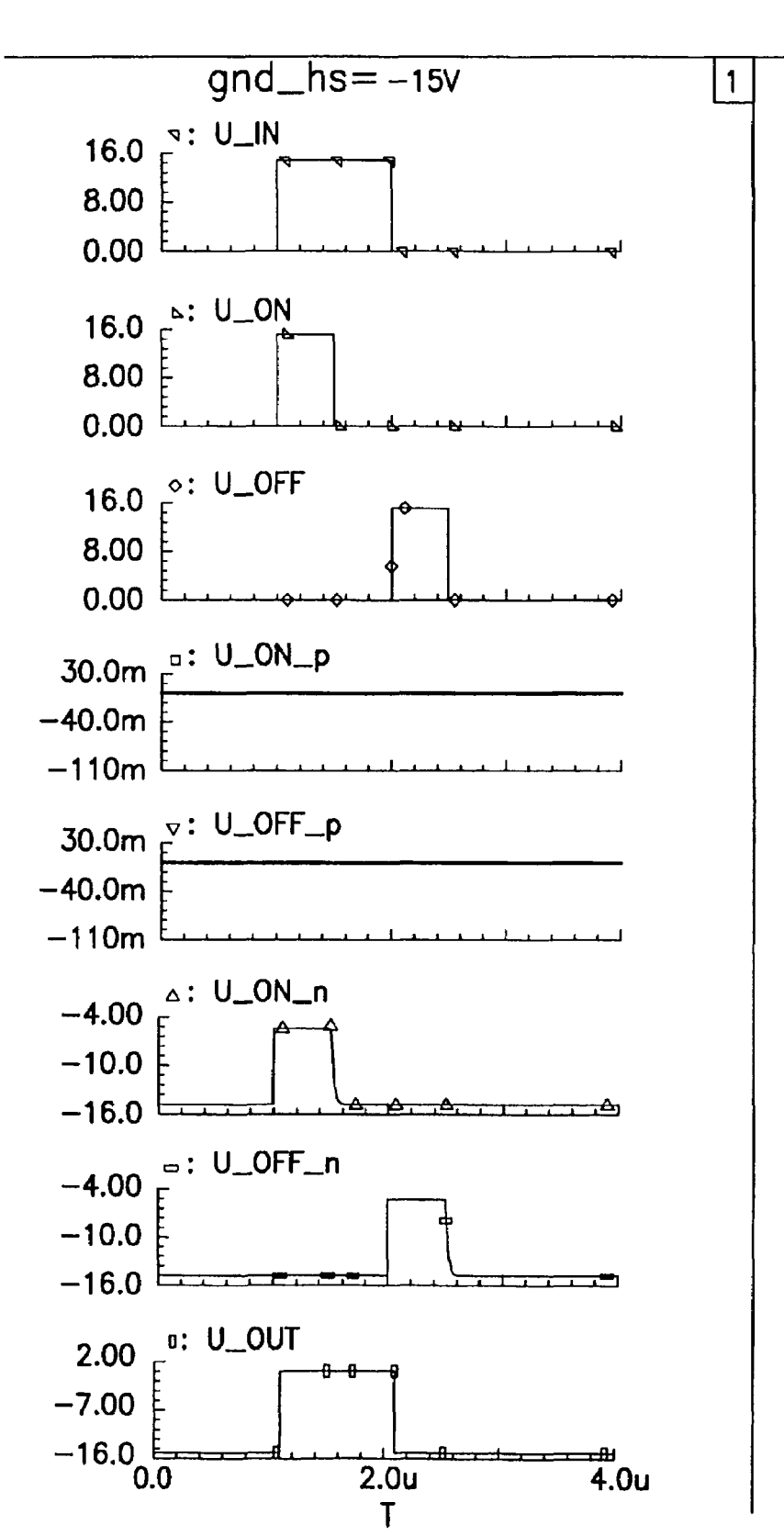
FIGS. 4A-C show simulation results for the method according to the invention.
Figure 4B:
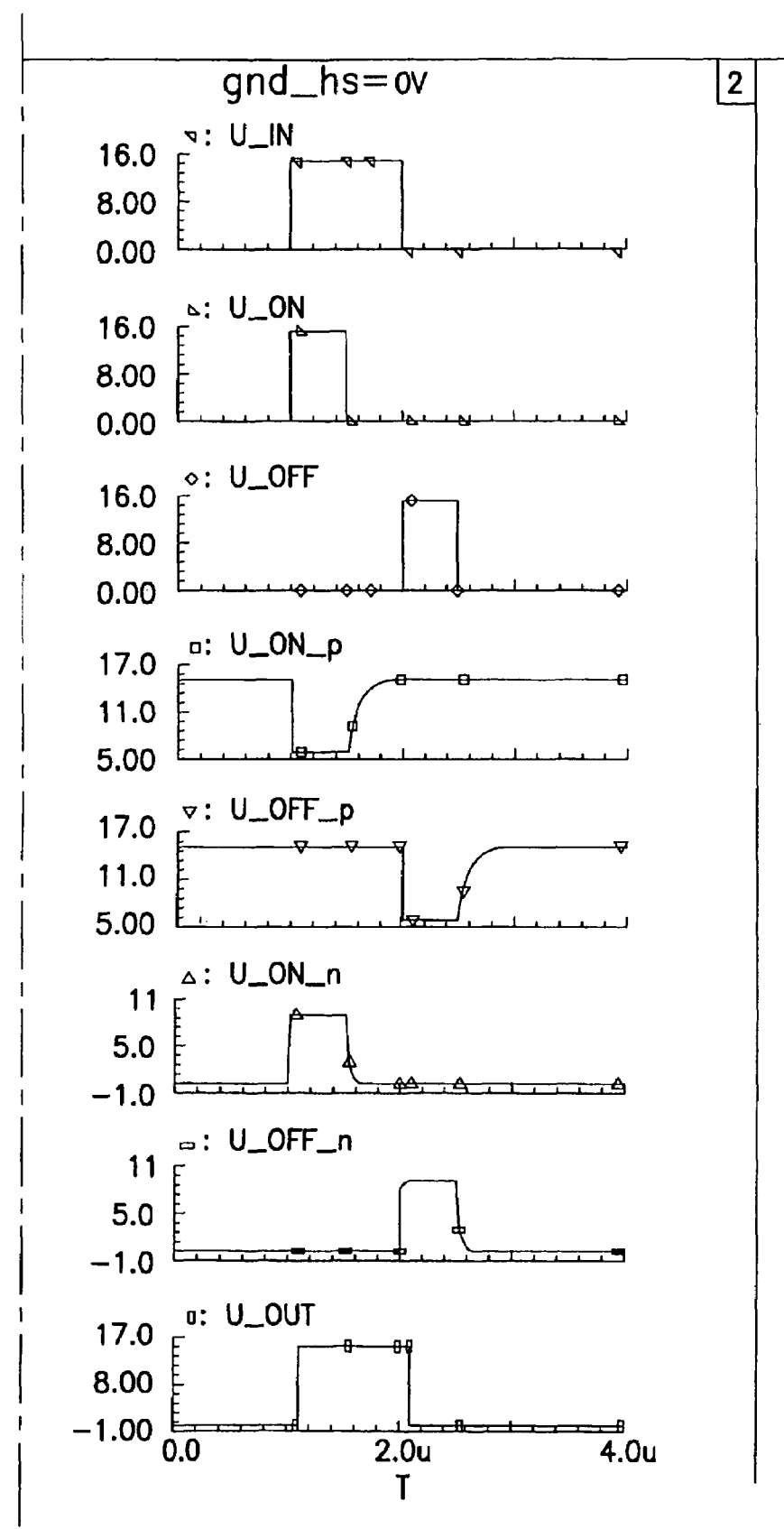
Figures 4, 4C:
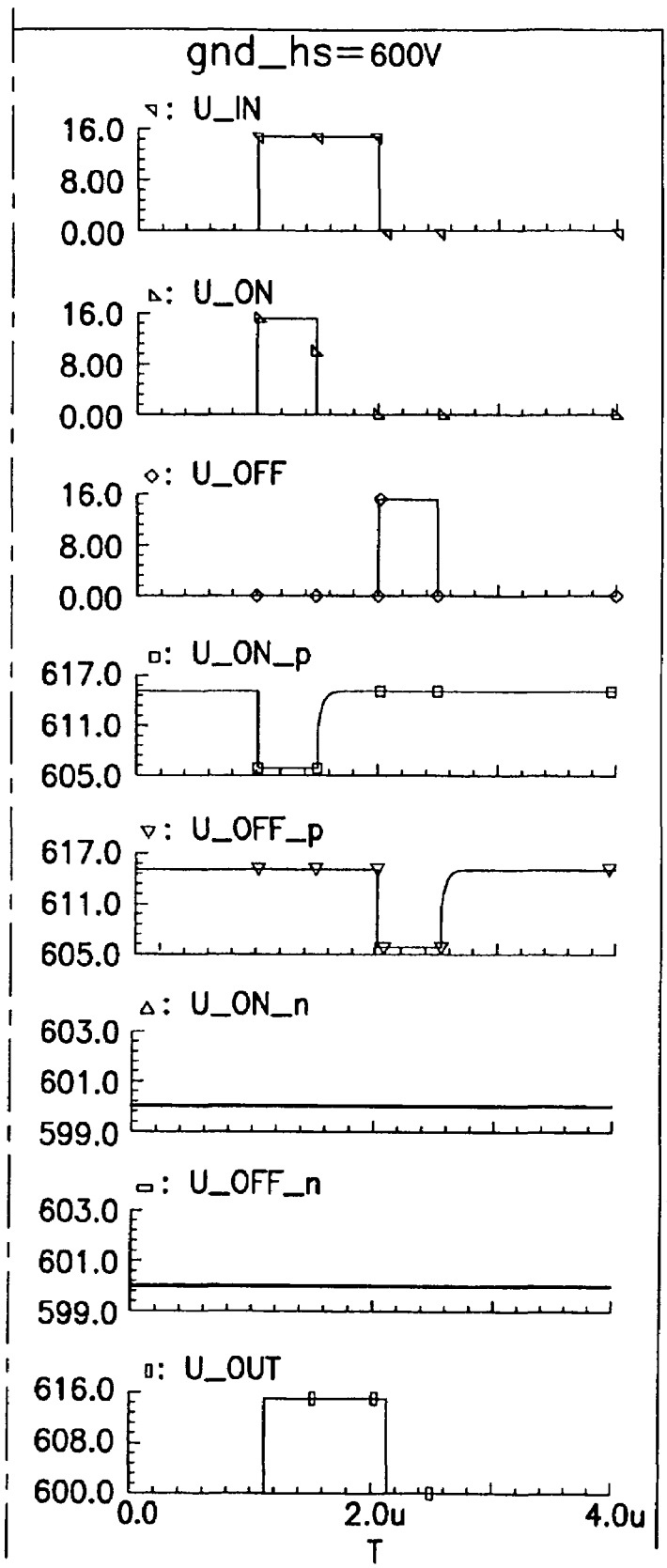

FIG. 3 shows a TOP level shifter 80 for a drive circuit according to the invention, in detail. In this context, FIGS. 4A-C show the simulation results for the method according to the invention.

TOP level shifter 80 has two complementary parts: UP level shifter path 84 and DOWN level shifter path 86. Their design and method of operation are in principle the same, although respectively complementary transistors are used, in each case, that is to say n-channel transistors in the UP level shifter path, with p-channel transistors in the DOWN level shifter path, or vice-versa. Connections to the supply voltage (vdd_hs) in the UP level shifter path 84 are connected to the corresponding reference-ground potential (gnd_hs) in the DOWN level shifter path 86, and vice-versa. The reference-ground potential (gnd_hs) is in this case equal to the potential at the output of half bridge 70. The design of the UP and DOWN level shifter paths will be explained in detail below.

UP level shifter path 84 is itself formed from two branch elements each having respective switching transistors M1 and M2, respective high-voltage transistors HV1 and HV2, preferably each of the n-channel type, respective diodes D1 and D2 as well as respective resistors R1 and R5, as well as R2 and R6. These components in the respective branch elements are connected in series. The source connections of respective switching transistors M1 and M2 are connected to a reference-ground potential (gnd_pri) on the primary side via respective resistors R1 and R2. The respective gates of M1 and M2 are connected to the ON (non-inverted) and OFF (inverted) outputs of pulse-generating circuit 82 and represent the control inputs of the UP level shifter path. The gates of transistors HV1 and HV2 are connected to a first supply voltage (vdd_pri) on the primary side. The drain connections of HV1 and HV2, respectively, are connected to the respective cathodes of diodes D1 and D2. The anodes of diodes D1 and D2 are connected to respective resistors R5 and R6. R5 and R6 are also connected to a second supply voltage (vdd_hs). The anodes of D1 and D2, form the outputs ON_p and OFF_p, respectively, of UP level shifter path 84 and are connected to signal evaluation circuit 88.

DOWN level shifter path 86 analogously comprises two path elements with respective switching transistors M11 and M12, respective transistors M13 and M14, which preferably have a higher withstand voltage and are of the p-channel type, respective diodes D11 and D12 as well as the respective resistors R11 and R15 as well as R12 and R16. These components in respective branch element are connected in series. The source connections of respective switching transistors M11 and M12 are connected via respective resistors R11 and R12 to supply voltage (vdd_pri) on the primary side. The gates of M11 and M12, respectively, are connected via respective inverters INV1 and INV2 to the ON and OFF outputs, respectively, of pulse-generating circuit 82, and represent the control inputs for the DOWN level shifter path. The gates of M13 and M14 are connected to reference-ground potential (gnd_pri) on the primary side. The drain connections of M13 and M14, are connected to respective anodes of diodes D11 and D12. The cathodes of diodes D11 and D12 are connected to respective resistors R15 and R16. R15 and R16 are also connected to the reference potential (gnd_hs) on the secondary side. The cathodes of D11 and D12, form the respective outputs ON_n and OFF_n of DOWN level shifter path (86), and are each connected to the signal evaluation circuit (88).

Zener diodes Z1 and Z2 and connected to resistors R5 and R6, respectively as well as Z11 and Z12 similarly connected to R15 and R16 and limit the voltages at the respective outputs ON_p and OFF_p, as well as ON_n and OFF_n.

Resistors R3 and R4 in UP level shifter path 84 are connected to the operating voltage connection (vdd_pri) on the primary side, and are each connected to the source of respective transistors HV1 and HV2. When the primary side is in an undefined state, transistors HV1 and HV2 are therefore always switched off. Resistors R13 and R14 carry out the analogous function to transistors M13 and M14 in DOWN level shifter path 86.

The maximum permissible positive voltage difference between the reference-ground potential on the primary side and that on the secondary side is governed by the drain-source withstand voltage of transistors HV1 and HV2, and for negative voltage differences it is governed by the drain-source withstand voltage of transistors M13 and M14.

Signals are transmitted via UP level shifter path 84 only when reference-ground potential (gnd_hs) on the secondary side is substantially equal to or higher than, the reference-ground potential (gnd_pri) on the primary side. The method of operation of UP level shifter path 84 will be described for this situation below. The corresponding signal waveforms of the inputs and outputs on the respective nodes are illustrated for the corresponding situation in FIG. 4B (gnd_hs=0V) and FIG. 4C (gnd_hs=600V), respectively. A control signal U_ON which is generated by pulse-generating circuit 82 from a positive flank of the input signal U_IN for example a square-wave pulse, is passed to the gate of switching transistor M1. A control signal U_OFF, which is generated by pulse-generating circuit 82 from a negative flank of the input signal U_IN, for example a square-wave pulse, is passed to the gate of switching transistor M2. The control signals in each case cause one of the transistors M1 or M2 to be switched on. When transistor M1 is switched on, transistor HV1 is likewise opened, and when transistor M2 is switched on, transistor HV2 is opened (cascode principle). On switching on, a parallel current Ipar flows through the level shifter path. The magnitude of parallel current Ipar is governed mainly by the respective resistors R1 and R5, as well as R2 and R6. The voltage drops U_ON_p across resistor R5 and U_OFF_p across R6 are proportional to parallel current Ipar, and represent the respective input signals for signal evaluation circuit 88. In summary, the digital input signal (U_IN) is therefore converted to current signals, and is thus transmitted via the level shifter. Connected signal evaluation circuit 88 converts the transmitted signal back to a digital signal U_OUT, which is passed to driver 40 for TOP switch 70.

If the difference between the reference potential (gnd_hs) on the secondary side and that on the primary side is less than a specific value, for example a few volts, then the predetermined switch-on threshold, which is predetermined in signal evaluation circuit 88 by a signal value detection circuit, for example a comparator or Schmitt trigger, is not reached. In this case, the input voltage U_IN is not transmitted via the UP level shifter. The output voltage from the UP level shifter then corresponds to the switched-off state (U_ON_p=HIGH). If the potential on the secondary side falls to such an extent that the drain-bulk diodes of transistors M1, M2, HV1 and HV2 become forward-biased, that is to say the supply potential (vdd_sec) on the secondary side falls below the reference-ground potential (gnd_pri) on the primary side, then the diodes Di and D2 block any current flow through both path elements.

Signals are transmitted analogously via the DOWN level shifter path 86 only when the reference-ground potential (gnd_hs) on the secondary side is substantially equal to or less than the reference-ground potential (gnd_pri) on the primary side. The corresponding signal waveforms at the inputs and outputs and the respective nodes are illustrated for a corresponding situation in FIG. 4A (gnd_hs=15V) and FIG. 4B (gnd_hs=0V), respectively. A control signal U_ON, which is generated by the pulse-generating circuit (82) from a positive flank of the input signal U_IN, is passed in inverted form to the gate of the p-channel switching transistor M11. A control signal U_OFF which is generated by the pulse-generating circuit 82 from the negative flank of the input signal U_IN, is passed in inverted form to the gate of the p-channel switching transistor M12. The control signals in each case cause one of transistors M11 or M12 to switch on. When M11 is switched on, the p-channel transistor M13 is likewise opened, and M11 is opened when M12 is switched on (cascode principle). On switching on, a parallel current Ipar flows through the level shifter path. The magnitude of the parallel current Ipar is governed mainly by resistors R11 and R15, as well as R12 and R16. The voltage drops U_ON_n across resistor R15 and U_OFF_n across R16 are proportional to the parallel current Ipar and represent the respective input signals for signal evaluation circuit (88). It is therefore also possible to reliably transmit a signal U_IN in these potential conditions between the reference-ground potential (grd_hs) on the secondary side and the reference-ground potential (gnd_pri) on the primary side, with this signal U_IN being passed as the output signal U_OUT to driver 40 for TOP switch 70.

If the difference between the reference-ground potential (gnd_hs) on the secondary side and that on the primary side (gnd_pri) is above a specific value, for example a few volts, then the predetermined switch-on threshold, which is predetermined in the signal evaluation circuit 88 by a signal value detection circuit, for example a comparator or Schmitt trigger, is not reached. In this case, the input voltage U_IN is not transmitted via the DOWN level shifter. The output voltage from the DOWN level shifter then corresponds to the switched-off state (U_ON_n=LOW). If the potential on the secondary side rises, the reference-ground potential (gnd_hs) on the secondary side rises above the potential of the supply voltage (vdd_pri) on the primary side, then diodes D11 and D12 block any current flow through both path elements.

If the difference between the reference-ground potential (gnd_hs) on the secondary side is within the region of a few volts above or below the reference-ground potential (gnd_pri) on the primary side, then both the UP level shifter path 84 and the DOWN level shifter path 86 transmit valid signals from the primary side to the secondary side (see FIG. 4B (gnd_hs=0V). This overlapping range ensures reliable similar transmission even taking into account scatters in the transmission thresholds in different examples of the same circuitry, technology-dependent fluctuations in component parameters, and rapid changes in the reference-ground potential on the secondary side. This increases the reliability of level shifter 80.

The signal evaluation circuit 88 produces a valid drive signal (U_OUT) for the TOP driver (40) when a signal is transmitted either via UP level shifter path 84 (see FIG. 4C (gnd_hs=600V)) or DOWN level shifter path 86 (see FIG. 4A (gnd_hs=−15 v)), or via both level shifter paths (see FIG. 4B (gnd_hs=0V)) at the same time (OR logic operation).

FIGS. 4A-C show the transient transfer function of level shifter 80 as shown in FIG. 3 during a simulation, for a negative reference-ground potential on the secondary side (gnd_hs=−15V, FIG. 4A), for the same reference-ground potential on the primary side and secondary side (gnd_hs=0V FIG. 4B), and for a positive reference-ground potential on the secondary side (gnd_hs=600V, FIG. 4C). The reference ground potential (gnd_pri) on the primary side is in this case the actual ground potential (0V). The same square-wave drive signal U_IN has been passed to the input IN in both cases. As can be seen from the figure, if the reference-ground potentials on the primary side and secondary side are the same (FIG. 4B), a transmitted signal appears both at the outputs of the UP level shifter (U_ON_p, U_OFF_p) and of the outputs of the DOWN level shifter (U_ON_n, VOFFn) while, in contrast, if the reference-ground potential is negative only at the output of the DOWN level shifter (FIG. 4A; U_ON_n, U_OFF_n) if the reference-ground potential is positive only at the output of the UP level shifter (FIG. 4C; U_ON_p, U_OFF_p) a transmitted signal appears and the output of the corresponding complementary level shifter path locks in the switched-off state. In all three cases, the signal evaluation circuit identifies the fact that at least one signal has been transmitted via the UP level shifter path and/or the DOWN level shifter path, and emits a valid output signal U_OUT. The level shifter 80 therefore has the desired response.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

We claim:

1. A TOP level shifter for use in a drive circuit useful for transmitting an input signal IN from drive logic to a TOP driver, the TOP level shifter comprising:
    a pulse generating circuit;
    an UP level shifter coupled to receive pulses generated by said pulse generating circuit;
    a DOWN level shifter coupled to receive pulses generated by said pulse generating circuit, said DOWN level shifter being in parallel with said UP level shifter;
    a signal evaluation circuit coupled to receive outputs of said UP level shifter and said DOWN level shifter; and
    means for receiving first and second supply voltages;
    wherein said pulse generating circuit generates ON and OFF signals;
    wherein said UP level shifter includes first and second paths,
    said first path of said UP level shifter being formed of first and second n-channel transistors, connected in cascode, the drain of said first transistor being coupled to the source of said second transistor;
        wherein the gate of said first transistor is coupled to receive said ON signal from said pulse generating circuit;
        wherein the source of the first transistor is coupled to a first ground potential through a first resistor;
        wherein the junction of said drain of said first transistor and the gate of said second transistor is adapted to receive said first supply voltage through a second resistor;
        wherein the gate of said second transistor is also adapted to receive said first supply voltage;

wherein the drain of said second transistor is coupled to a cathode of a first diode;

wherein the anode of said first diode serves as the ON output of said UP level shifter path and is coupled to receive said second supply voltage through a third resistor;

said second path of said UP level shifter being formed of third and fourth n-channel transistors, connected in cascode, the drain of said third transistor being coupled to the source of said fourth transistor;

wherein the gate of said third transistor is coupled to receive said OFF signal from said pulse generating circuit;

wherein the source of the third transistor is coupled to said first ground potential through a fourth resistor;

wherein the junction of said drain of said third transistor and the gate of said fourth transistor is adapted to receive said first supply voltage through a fifth resistor;

wherein the gate of said fourth transistor is also adapted to receive said first supply voltage;

wherein the drain of said fourth transistor is coupled to a cathode of a second diode; and wherein the anode of said second diode serves as the OFF output of said UP level shifter path and is coupled to receive said second supply voltage through a sixth resistor.

2. The TOP level shifter of claim 1, wherein said UP level shifter is substantially complementary to said DOWN level shifter.

3. The TOP level shifter of claim 1, wherein said signal evaluation circuit generates the input signal for the TOP driver based on the outputs of the UP and DOWN level shifters.

4. The TOP level shifter of claim 1, wherein the TOP level shifter is monolithically integrated with the drive logic and the TOP driver.

5. A TOP level shifter for use in a drive circuit useful for transmitting an input signal IN from drive logic to a TOP driver, the TOP level shifter comprising:

a pulse generating circuit;

an UP level shifter coupled to receive pulses generated by said pulse generating circuit;

a DOWN level shifter coupled to receive pulses generated by said pulse generating circuit, said DOWN level shifter being in parallel with said UP level shifter;

a signal evaluation circuit coupled to receive outputs of said UP level shifter and said DOWN level shifter; and means for receiving a first supply voltage;

wherein said pulse generating circuit generates ON and OFF signals;

wherein said DOWN level shifter includes first and second paths, said first path of said DOWN level shifter being formed of fifth and sixth p-channel transistors, connected in cascode, the drain of said fifth transistor being coupled to the source of said sixth transistor;

wherein the gate of said fifth transistor is coupled to receive an inverted ON signal from said pulse generating circuit;

wherein the source of the fifth transistor is coupled to said first supply voltage through a seventh resistor;

wherein the junction of said drain of said fifth transistor and the gate of said sixth transistor is coupled to a first ground potential through an eighth resistor;

wherein the gate of said sixth transistor is also coupled to said first ground potential;

wherein the drain of said sixth transistor is coupled to an anode of a third diode;

wherein the cathode of said third diode serves as the ON output of said DOWN level shifter path and is coupled to a second ground potential through a ninth resistor;

said second path of said DOWN level shifter being formed of third and fourth n-channel transistors, connected in cascode, the drain of said seventh transistor being coupled to the source of said eighth transistor;

wherein the gate of said seventh transistor is coupled to receive an inverted OFF signal from said pulse generating circuit;

wherein the source of the seventh transistor is coupled to said first supply voltage through a tenth resistor;

wherein the junction of said drain of said seventh transistor and the gate of said eighth transistor is coupled to said first ground potential through an eleventh resistor;

wherein the gate of said eighth transistor is coupled to said second ground potential;

wherein the drain of said eighth transistor is coupled to an anode of a fourth diode; and wherein the cathode of said fourth diode serves as the OFF output of said DOWN level shifter path and is coupled to said second ground potential through a twelfth resistor.

6. The TOP level shifter of claim 5 further comprising means for receiving a second supply voltage;

wherein said pulse generating circuit generates ON and OFF signals;

wherein said UP level shifter includes first and second paths, said first path of said UP level shifter being formed of first and second n-channel transistors, connected in cascode, the drain of said first transistor being coupled to the source of said second transistor;

wherein the gate of said first transistor is coupled to receive said ON signal from said pulse generating circuit;

wherein the source of the first transistor is coupled to ground through a first resistor;

wherein the junction of said drain of said first transistor and the gate of said second transistor is adapted to receive said first supply voltage through a second resistor;

wherein the gate of said second transistor is also adapted to receive said first supply voltage;

wherein the drain of said second transistor is coupled to a cathode of a first diode;

wherein the anode of said first diode serves as the ON output of said UP level shifter path and is coupled to receive said second supply voltage through a third resistor;

said second path of said UP level shifter being formed of third and fourth n-channel transistors, connected in cascode, the drain of said third transistor being coupled to the source of said fourth transistor;

wherein the gate of said third transistor is coupled to receive said OFF signal from said pulse generating circuit;

wherein the source of the third transistor is coupled to ground through a fourth resistor;

wherein the junction of said drain of said third transistor and the gate of said fourth transistor is adapted to receive said first supply voltage through a fifth resistor;

wherein the gate of said fourth transistor is also adapted to receive said first supply voltage;

wherein the drain of said fourth transistor is coupled to a cathode of a second diode; and wherein the anode of said second diode serves as the OFF output of said UP level shifter path and is coupled to receive said second supply voltage through a sixth resistor.

7. The TOP level shifter of claim 1, wherein the magnitude of the potential of the ground is capable of fluctuating up to a maximum potential substantially equal to the maximum possible voltage that the UP and DOWN shifter path can withstand, without impairing the functioning of the drive circuit.

8. A method for transmitting an input signal IN from a drive logic circuit to a TOP driver within a drive circuit having a TOP level shifter, the TOP level shifter comprising:
- a pulse generating circuit;
- an UP level shifter coupled to receive pulses generated by said pulse generating circuit;
- a DOWN level shifter coupled to receive pulses generated by said pulse generating circuit, said DOWN level shifter being in parallel with said UP level shifter; and
- a signal evaluation circuit coupled to receive outputs of said UP level shifter and said DOWN level shifter;

the method comprising:

passing an output signal OUT to the TOP driver when at least one of the UP and DOWN level shifters emits a valid control signal to said signal evaluation circuit;

wherein said UP level shifter path emits a valid control signal to said signal evaluation circuit when the ground potential on its secondary side is substantially equal to or higher than the ground potential on its primary side, and said DOWN level shifter path emits a valid control signal to said signal evaluation circuit when the ground potential on its secondary side is substantially equal to or lower than the wound potential on its primary side.

* * * * *